US009484542B2

United States Patent
Kim et al.

(10) Patent No.: US 9,484,542 B2
(45) Date of Patent: Nov. 1, 2016

(54) THIN FILM TRANSISTOR PANEL AND METHOD OF MANUFACTURING THE SAME, AND ELECTRONIC DEVICE INCLUDING THE THIN FILM TRANSISTOR PANEL

(71) Applicant: Samsung Electronics Co., Ltd., Suwon-Si, Gyeonggi-Do (KR)

(72) Inventors: Joo-Young Kim, Hwaseong-si (KR); Bon Won Koo, Suwon-si (KR); Jeong Il Park, Seongnam-si (KR); Jong Won Chung, Hwaseong-si (KR); Ji Young Jung, Seoul (KR); Hye Yeon Yang, Yongin-si (KR); Bang Lin Lee, Suwon-si (KR); Eun Kyung Lee, Seoul (KR); Ji Youl Lee, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 6 days.

(21) Appl. No.: 14/029,924

(22) Filed: Sep. 18, 2013

(65) Prior Publication Data

US 2014/0225080 A1    Aug. 14, 2014

(30) Foreign Application Priority Data

Feb. 13, 2013    (KR) .................. 10-2013-0015399

(51) Int. Cl.
*H01L 51/05*    (2006.01)
*B82Y 10/00*    (2011.01)
(Continued)

(52) U.S. Cl.
CPC ....... *H01L 51/0545* (2013.01); *H01L 27/3258* (2013.01); *H01L 27/3274* (2013.01)

(58) Field of Classification Search
CPC ........... H01L 51/0545; H01L 51/0036; H01L 51/0541; H01L 51/5012; H01L 27/3258; H01L 27/3274; B82Y 10/00

USPC .................................. 257/40; 438/82, 99
See application file for complete search history.

(56) References Cited

U.S. PATENT DOCUMENTS 7,638,358 B2    12/2009 Oh et al.
7,820,999 B2    10/2010 Huisman et al.
(Continued)

FOREIGN PATENT DOCUMENTS

JP    2005-277238 A    10/2005
JP    2006-520101 A    8/2006
(Continued)

OTHER PUBLICATIONS

Fujisaki et al. "Liquid Crystal Display Cells Fabricated on Plastic Substrate Driven by Low-Voltage Organic Thin-Film Transistor With Improved Gate Insulator and Passivation Layer," Japanese Journal of Applied Physics, 2005, p. 3728-3732, vol. 44, No. 6A, The Japan Society of Applied Physics.
(Continued)

*Primary Examiner* — John C Ingham
*Assistant Examiner* — Didarul Mazumder
(74) *Attorney, Agent, or Firm* — Harness, Dickey & Pierce, P.L.C.

(57) ABSTRACT

A thin film transistor panel includes a gate electrode on a substrate, a gate insulating layer on the gate electrode, an organic semiconductor overlapping with the gate electrode, a source electrode and a drain electrode electrically connected to the organic semiconductor, a fluorine-containing organic insulation layer covering the organic semiconductor, and a photosensitive organic insulation layer covering the fluorine-containing organic insulation layer.

16 Claims, 6 Drawing Sheets

(51) Int. Cl.
*H01L 51/00* (2006.01)
*H01L 51/50* (2006.01)
*H01L 27/32* (2006.01)

(56) References Cited

U.S. PATENT DOCUMENTS

| | | |
|---|---|---|
| 8,258,004 B2 | 9/2012 | Oh et al. |
| 2005/0211975 A1 | 9/2005 | Kawasaki et al. |
| 2006/0081849 A1* | 4/2006 | Lee et al. ............... 257/72 |
| 2006/0220126 A1 | 10/2006 | Huisman et al. |
| 2007/0114524 A1* | 5/2007 | Oh et al. ............... 257/40 |
| 2008/0084603 A1* | 4/2008 | Song et al. ............... 359/296 |
| 2008/0258138 A1* | 10/2008 | Song et al. ............... 257/40 |
| 2009/0026444 A1* | 1/2009 | Choi ............... H01L 27/283 257/40 |
| 2010/0090220 A1 | 4/2010 | Kawasaki et al. |
| 2011/0014736 A1* | 1/2011 | Kim et al. ............... 438/34 |
| 2011/0175080 A1* | 7/2011 | Kim ............... H01L 29/7869 257/43 |

FOREIGN PATENT DOCUMENTS

| | | |
|---|---|---|
| KR | 2007-0053060 A | 5/2007 |
| KR | 2008-0095073 A | 10/2008 |
| KR | 2009-0058995 A | 6/2009 |

OTHER PUBLICATIONS

Han et al. "Lifetime of Organic Thin-Film Transistors With Organic Passivation Layers," Applied Physics Letters, 2006, p. 1-3, vol. 88, Issue 7, American Institute of Physics.

* cited by examiner

THIN FILM TRANSISTOR PANEL AND METHOD OF MANUFACTURING THE SAME, AND ELECTRONIC DEVICE INCLUDING THE THIN FILM TRANSISTOR PANEL

CROSS-REFERENCE TO RELATED APPLICATION

This application claims priority to and the benefit of Korean Patent Application No. 10-2013-0015399 filed in the Korean Intellectual Property Office on Feb. 13, 2013, the entire contents of which are incorporated herein by reference.

BACKGROUND

1. Field

Some example embodiments provide a thin film transistor panel, a method of manufacturing the same, and an electronic device including the thin film transistor panel.

2. Description of the Related Art

A flat panel display such as a liquid crystal display (LCD), an organic light emitting diode (OLED) display, an electrophoretic display, and the like includes a pair of electric field-generating electrodes and an electrical optical active layer interposed therebetween. The liquid crystal display (LCD) includes a liquid crystal layer as an electro-optical active layer, and the organic light emitting diode (OLED) display includes an organic emission layer as an electro-optical active layer.

One of the pair of the electric field-generating electrodes is commonly connected to a switching device and receives an electrical signal, and the electro-optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode.

Research on an organic thin film transistor (OTFT) including an organic semiconductor such as a low molecular weight compound or polymer instead of an inorganic semiconductor such as silicon (Si) as an active channel layer are being actively conducted.

The organic thin film transistor may be made into a fiber or a film due to characteristics of an organic material, and thus is drawing attention as a main component for a flexible display device.

However, an organic semiconductor used in the organic thin film transistor may be more easily damaged in subsequent processes due to the characteristics of the organic material.

SUMMARY

Some example embodiments provide a thin film transistor panel having a structure capable of decreasing damage to an organic semiconductor layer thus having little influence on electrical characteristics of a thin film transistor.

Other example embodiments provide a method of manufacturing the thin film transistor panel. Other example embodiments provide an electronic device including the thin film transistor panel.

According to an example embodiment, a thin film transistor panel includes a gate electrode on a substrate, a gate insulating layer on a gate electrode, a gate insulating layer on the gate electrode, an organic semiconductor overlapping with the gate electrode across a gate insulating layer, a source electrode and a drain electrode electrically connected to the organic semiconductor, a fluorine-containing organic insulation layer covering the organic semiconductor, and a photosensitive organic insulation layer covering the fluorine-containing organic insulation layer.

The fluorine-containing organic insulation layer may include at least one of a fluorine-based polymer and a fluorine-based solvent.

The fluorine-containing organic insulation layer may include at least one of a perfluorinated polymer, polytetrafluoroethylene (PTFE), a fluorinated ethylene propylene (FEP), a poly(fluoro alkoxy), ethylene tetrafluoroethylene (ETFE), polyvinylidene fluoride (PVDF), and a perfluoro (alkenylvinyl ether).

The fluorine-containing organic insulation layer may be non-photosensitive.

The fluorine-containing organic insulation layer may have a thickness of about 0.1 μm to about 1.0 μm.

The photosensitive organic insulation layer may include at least one of polyacryl, polysiloxane, and polyimide.

The photosensitive organic insulation layer may have a thickness of about 0.1 μm to about 1.0 μm.

The fluorine-containing organic insulation layer and the photosensitive organic insulation layer may include a contact hole having a same plane shape.

The fluorine-containing organic insulation layer and the photosensitive organic insulation layer may be formed on the whole surface of the substrate except for the contact hole.

According to another example embodiment, a method of manufacturing a thin film transistor panel includes forming a gate electrode on a substrate, forming a gate insulating layer on the gate electrode, forming an organic semiconductor overlapping with the gate electrode on the gate insulating layer, forming a source electrode and a drain electrode electrically connected to the organic semiconductor, forming a fluorine-containing organic insulation layer on the organic semiconductor, forming a photosensitive organic insulation layer on the fluorine-containing organic insulation layer, wet-etching the photosensitive organic insulation layer to form a patterned photosensitive organic insulation layer, and dry-etching the fluorine-containing organic insulation layer using the patterned photosensitive organic insulation layer as a mask.

The fluorine-containing organic insulation layer and the photosensitive organic insulation layer may be formed at a temperature of less than or equal to about 150° C., respectively.

The method may further include surface treating the fluorine-containing organic insulation layer after forming the fluorine-containing organic insulation layer.

The surface treatment may include using oxygen plasma.

The method may further include thermal curing the photosensitive organic insulation layer at a temperature of less than or equal to about 150° C. after wet-etching the photosensitive organic insulation layer.

The method may further include thermal curing the photosensitive organic insulation layer at a temperature of about 70° C. to 150° C. after the patterning the photosensitive organic insulation layer.

According to yet another example embodiment, an electronic device includes the thin film transistor panel.

The electronic device may include at least one of a liquid crystal display (LCD), an organic light emitting diode (OLED) device, an electrophoretic display, and an organic sensor.

DETAILED DESCRIPTION

Figure 1:
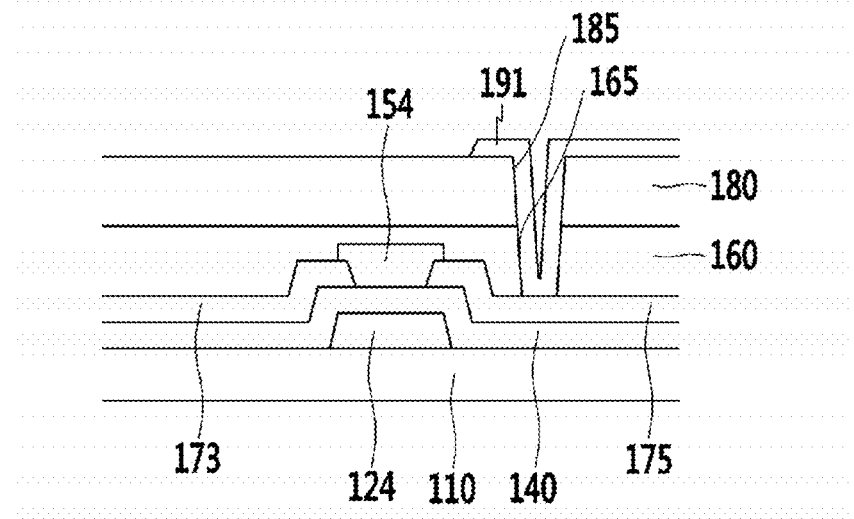
FIG. 1 is a cross-sectional view showing a thin film transistor panel according to an example embodiment.

The present disclosure will be described more fully hereinafter with reference to the accompanying drawings, in which some example embodiments are shown. This disclosure may, however, be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a thin film transistor panel according to an example embodiment is illustrated. FIG. 1 is a cross-sectional view showing a thin film transistor panel according to an example embodiment.

A gate electrode 124 is formed on a substrate 110 made of transparent glass, silicon, plastic, or the like. The gate electrode 124 is connected to a gate line (not shown) transmitting a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

A gate insulating layer 140 is formed on the gate electrode 124. The gate insulating layer 140 may be made of an organic material or an inorganic material, examples of the organic material may include a polyvinyl alcohol compound, a polyimide compound, a polyacryl compound, a polystyrene compound, and a dissoluble polymer compound such as benzocyclobutane (BCB), and examples of the inorganic material may include silicon nitride ($SiN_x$), silicon oxide ($SiO_2$), aluminum oxide ($AlO_x$) or a combination thereof.

A source electrode 173 and a drain electrode 175 are formed on the gate insulating layer 140. The source electrode 173 and the drain electrode 175 face each other with the gate electrode 124 therebetween. The source electrode 173 is connected to a data line (not shown) transmitting a data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or a combination thereof, but are not limited thereto.

An organic semiconductor 154 is formed on the source electrode 173 and the drain electrode 175. The organic semiconductor 154 may be made of a low molecular weight compound or polymer, and for example includes at least one selected from pentacene and a precursor thereof, tetrabenzoporphyrin and a derivative thereof, polyphenylene vinylene and a derivative thereof, polyfullerene and a derivative thereof, polythienylene vinylene and a derivative thereof, polythiophene and a derivative thereof, polythienothiophene and a derivative thereof, polyarylamine and a derivative thereof, phthalocyanine and a derivative thereof, metallized phthalocyanine or a halogenated derivative thereof, perylene tetracarboxylic dianhydride (PTCDA), naphthalene tetracarboxylic dianhydride (NTCDA), or an imide derivative thereof, perylene, or coronene, and a substituent-containing derivatives thereof. Of these, the organic semiconductor 154 may be made of a low molecular weight compound such as pentacene or perylene.

A fluorine-containing organic insulation layer 160 is formed to cover the organic semiconductor 154. The fluorine-containing organic insulation layer 160 may include at least one of a fluorine-based polymer and a fluorine-based solvent, and may include, for example, a perfluorinated polymer, polytetrafluoroethylene (PTFE), fluorinated ethylene propylene (FEP), a poly(fluoro alkoxy), ethylene tetrafluoroethylene (ETFE), polyvinylidene fluoride (PVDF), a perfluoro(alkenyl vinyl ether), or a combination thereof.

The fluorine-containing organic insulation layer 160 may not be photosensitive. The fluorine-containing organic insulation layer 160 contacts the top of the organic semiconductor 154 and completely covers the organic semiconductor 154. The fluorine-containing organic insulation layer 160 is formed via solution process and cured at a relatively low temperature, and may prevent or inhibit thermal degradation of the organic semiconductor 154 and protect the organic semiconductor 154 from chemicals such as an etchant, a developer, and/or a stripper used during a subsequent photo-patterning and wet or dry etching processes. The fluorine-containing organic insulation layer 160 may have, for example, a thickness of about 0.1 µm to about 1.0 µm.

A photosensitive organic insulation layer 180 is formed on the fluorine-containing organic insulation layer 160. The photosensitive organic insulation layer 180 may be formed of a photosensitive organic material capable of a photo-patterning process, for example, a polyacryl, a polysiloxane, a polyimide, or a combination thereof.

The photosensitive organic insulation layer 180 may prevent or inhibit the fluorine-containing organic insulation layer 160 from being damaged in a subsequent process. Specifically, the photosensitive organic insulation layer 180 covers the fluorine-containing organic insulation layer 160 having relatively low hardness and that is more difficult to form as a relatively hard film, and thus, may prevent or inhibit degradation of or damage to the fluorine-containing organic insulation layer 160 in the subsequent process.

In addition, the photosensitive organic insulation layer 180 covers a fluorine-containing organic insulation layer 160 having relatively weak adhesion to an inorganic material such as an pixel electrode made of aluminum or ITO (indium tin oxide), and may prevent or inhibit lifting-off or separation of a pixel electrode 191 to be described. The photosensitive organic insulation layer 180 may have a thickness of about 0.1 to about 1.0 µm.

The fluorine-containing organic insulation layer 160 and the photosensitive organic insulation layer 180 may respectively have a plurality of contact holes 165 and 185 exposing the drain electrode 175. As described below, since the contact hole 165 of the fluorine-containing organic insulation layer 160 is etched by using the contact hole 185 of the photosensitive organic insulation layer 180 as a mask, the contact hole 165 of the fluorine-containing organic insulation layer 160 has a substantially same plane shape to the contact hole 185 of the photosensitive organic insulation layer 180.

The fluorine-containing organic insulation layer 160 and the photosensitive organic insulation layer 180 may be formed on the whole surface of the substrate 110 except for the contact holes 165 and 185 and a plurality of contact holes (not shown) exposing a pad part (not shown).

A pixel electrode 191 is formed on the photosensitive organic insulation layer 180. The pixel electrode 191 may be formed of a transparent conductor, for example, indium tin oxide (ITO) or indium zinc oxide (IZO), or an opaque conductor, for example, aluminum (Al), molybdenum (Mo), silver (Ag), or an alloy thereof. The pixel electrode 191 is electrically connected to the drain electrode 175 through the contact holes 165 and 185.

The aforementioned thin film transistor panel may be included in, for example, various electronic devices including a liquid crystal display (LCD), an organic light emitting diode (OLED) device, a solar cell, and an organic sensor.

FIGS. 2 to 8 are cross-sectional views sequentially showing a method of manufacturing the thin film transistor panel in FIG. 1.

Figure 2:
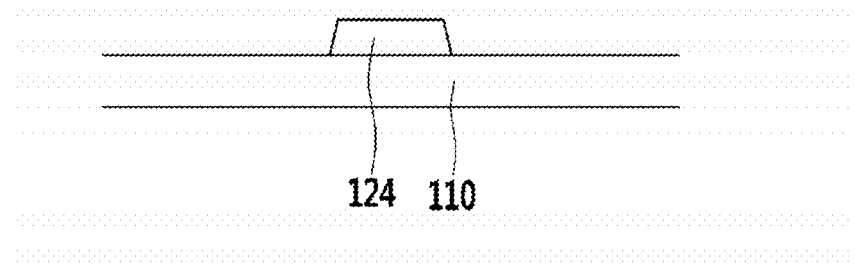
FIGS. 2 to 8 are cross-sectional views sequentially showing a method of manufacturing the thin film transistor panel according to the example embodiment in FIG. 1.

Referring to FIG. 2, a gate electrode 124 is formed by stacking a conductive layer on the substrate 110 through sputtering and performing photolithography.

Figure 3:
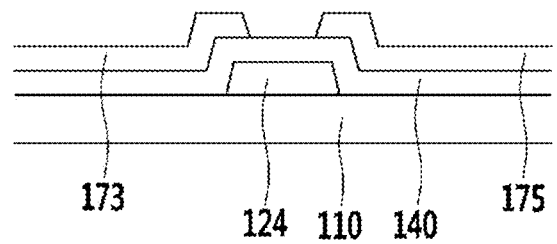

Referring to FIG. 3, a gate insulating layer 140 is formed on the gate electrode 124. The gate insulating layer 140 may be formed, for example, in a dry process such as chemical vapor deposition, or in a solution process such as spin coating, Inkjet printing, and the like. A source electrode 173 and a drain electrode 175 are formed on the gate insulating layer 140 by stacking a conductive layer through sputtering and performing photolithography.

Figure 4:
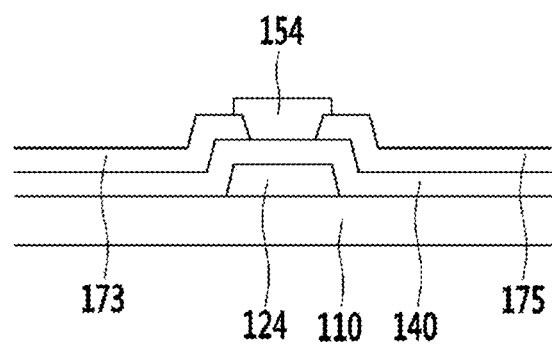

Referring to FIG. 4, an organic semiconductor 154 is formed on the source electrode 173 and the drain electrode 175. The organic semiconductor 154 may be formed in a vacuum process such as a thermal deposition, or a solution process such as spin coating, inkjet-printing, and the like.

Figure 5:
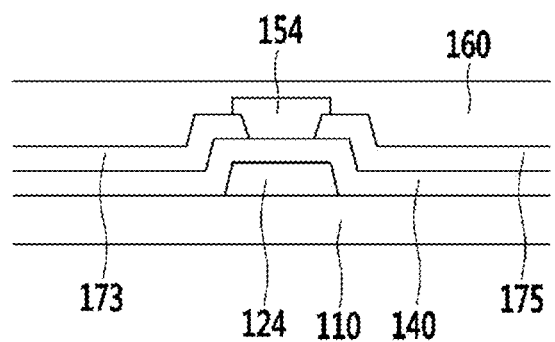

Referring to FIG. 5, a fluorine-containing organic insulation layer 160 is formed on the organic semiconductor 154. The fluorine-containing organic insulation layer 160 may be formed by solution coating, for example, a solution including a fluorine-based polymer and a solvent, a solution including an insulating polymer and a fluorine-based solvent, or a solution including a fluorine-based polymer and a fluorine-based solvent using the solution process such as spin-coating, slit-coating, or Inkjet-printing.

The coated fluorine-containing organic insulation layer 160 may be thermally cured. The coating and thermal curing of the fluorine-containing organic insulation layer 160 may be performed at a temperature of less than or equal to about 150° C., for example, in an inert atmosphere. For example, the coating and thermal curing may be performed at a temperature of about 25° C. to about 150° C., for example, about 50° C. to about 150° C. Since the coating and thermal curing is performed at a relatively low temperature, the fluorine-containing organic insulation layer 160 may prevent or inhibit thermal degradation of the organic semiconductor 154.

The fluorine-containing organic insulation layer 160 may be surface-treated. The surface treatment is performed to modify the hydrophobic surface of the fluorine-containing organic insulation layer 160 into a hydrophilic surface by, for example, using oxygen plasma.

Figure 6:
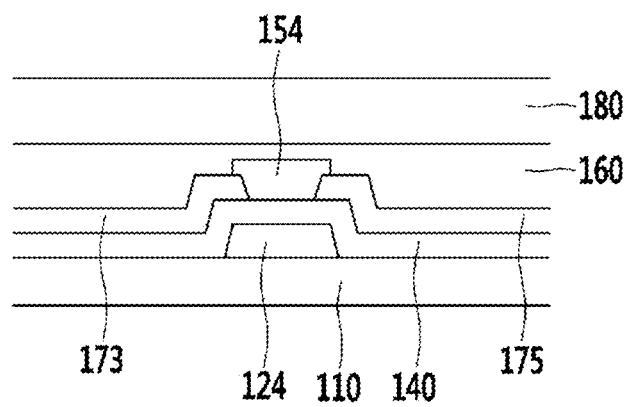

Referring to FIG. 6, a photosensitive organic insulation layer 180 is formed on the fluorine-containing organic insulation layer 160. The photosensitive organic insulation layer 180 may be formed by coating a solution prepared by mixing a photosensitive organic polymer such as a polyacryl, a polyimide, or a polysiloxane in a solvent such as propylene glycol monomethyl ether acetate (PGMEA) using a solution process such as spin coating, slit coating, or inkjet printing. Herein, the photosensitive organic insulation layer 180 may be formed to be thicker than a desired thickness, considering a dry etching process described below.

The coating of the photosensitive organic insulation layer 180 may be performed at a temperature of less than or equal to about 150° C. For example, the coating may be performed at a temperature ranging from about 25° C. to about 150° C., for example, about 50° C. to about 150° C. Since the coating is performed at a relatively low temperature, the photosensitive organic insulation layer 180 may prevent or inhibit thermal degradation of the organic semiconductor 154 and the fluorine-containing organic insulation layer 160.

Figure 7:
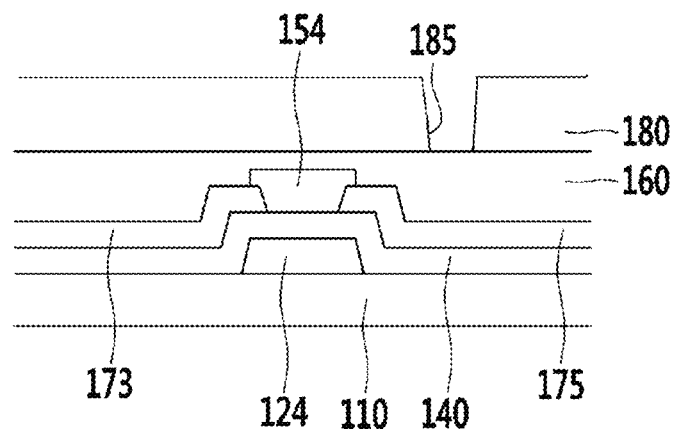

Referring to FIG. 7, the photosensitive organic insulation layer 180 is patterned using a photolithography process to form a plurality of contact holes 185. The photosensitive organic insulation layer 180 includes a photosensitive organic material, and therefore does not need an additional photosensitive film.

Subsequently, the patterned photosensitive organic insulation layer 180 may be thermally cured. This thermal curing may be performed at a temperature of less than or equal to about 150° C. For example, the curing may be performed at a temperature of about 70° C. to about 150° C. The thermal curing may harden the photosensitive organic insulation layer 180 and decrease physical damage to the photosensitive organic insulation layer 180 during dry etching as described below. In addition, the thermal curing may increase chemical resistance of the photosensitive organic insulation layer 180 when exposed to chemicals during formation of the pixel electrode 191 thereon.

Figure 8:
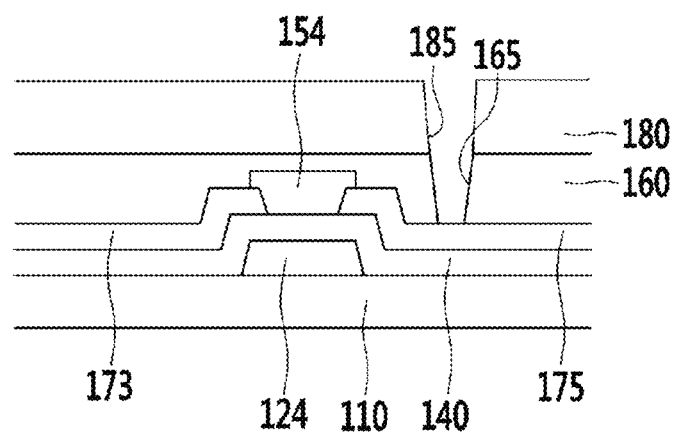

Referring to FIG. 8, the fluorine-containing organic insulation layer 160 may be patterned by dry etching using the patterned photosensitive organic insulation layer 180 as a mask, and thus, a plurality of contact holes 165 are formed. Herein, since the contact holes 165 are formed by using the patterned photosensitive organic insulation layer 180 as a mask, the contact holes 165 and 185 may have substantially same plane shapes.

Referring to FIG. 1, the pixel electrode 191 is then formed on the photosensitive organic insulation layer 180 by stacking a conductive layer through sputtering and performing photolithography.

Hereinafter, the present disclosure is illustrated in more detail with reference to examples. However, these embodiments are examples, and the present disclosure is not limited thereto.

Measurement of Thin Film Transistor

Example 1

A gate electrode is formed on a glass substrate by sputtering molybdenum and performing photolithography. A gate insulating layer is formed by depositing silicon oxide in a chemical vapor deposition (PECVD) method on the gate electrode. A source electrode and a drain electrode are formed on the gate insulating layer by sputtering Au and performing photolithography. A self-assembled monolayer is formed on the surface of the gate insulating layer using octadecyltrichlorosilane.

Subsequently, an organic semiconductor layer is formed on the source and drain electrodes by vacuum-depositing a heteroacene-based p-type semiconductor. A 500 nm-thick fluorine-containing organic insulation layer is then formed on the organic semiconductor layer by spin-coating CYTOP® (ASAHI GLASS Co.) and then thermally curing it at 120° C. in inert atmosphere. The fluorine-containing organic insulation layer is surface-treated with $O_2$ plasma (100 W, 10 seconds). A 1.5 µm-thick photosensitive organic insulation layer is then formed on the surface-treated fluorine-containing organic insulation layer by spin-coating a photoacryl (Dongjin Semichem Co., Ltd.) and heat-treating it at 100° C.

A photo mask is then disposed on the photosensitive organic insulation layer and exposed to UV light of 100 mJ/cm$^2$ and developed with a developer and washed with deionized water. The washed product is cured at 130° C. for 2 hours. The cured photosensitive organic insulation layer is used as a mask in dry etching the fluorine-containing organic insulation layer by $O_2$ plasma (400 W and 120 seconds). An Al electrode is then formed on the photosensitive organic insulation layer by depositing aluminum (Al) and performing photolithography, fabricating a thin film transistor device.

Comparative Example 1

A gate electrode is formed on a glass substrate by sputtering molybdenum thereon and performing photolithography. A gate insulating layer is formed on the gate electrode by depositing silicon oxide in a chemical vapor deposition (PECVD) method. A source electrode and a drain electrode are then formed by sputtering Au on the insulating layer and performing photolithography. Subsequently, a self-assembled layer is formed on the surface of the gate insulating layer with octadecyltrichlorosilane. An organic semiconductor layer is then formed on the source and drain electrodes by vacuum-depositing a heteroacene-based p-type semiconductor.

A 1.5 µm-thick fluorine-containing organic insulating layer is formed on the organic semiconductor layer by spin-coating CYTOP® (ASAHI GLASS Co.) and thermally curing it at 120° C. The fluorine-containing organic insulating layer is surface-treated with $O_2$ plasma (100 W, 10 seconds). An Al electrode is formed on the fluorine-containing organic insulating layer by depositing aluminum (Al) and performing photolithography, fabricating a thin film transistor device.

Comparative Example 2

A gate electrode is formed on a glass substrate by sputtering molybdenum and performing photolithography. A gate insulating layer is formed on the gate electrode by depositing silicon oxide in a chemical vapor deposition (PECVD) method. A source electrode and a drain electrode are formed by sputtering Au and performing photolithography. A self-assembled layer is then formed on the surface of the gate insulating layer with octadecyltrichlorosilane. An organic semiconductor layer is formed on the source and drain electrodes by vacuum-depositing a heteroacene-based p-type semiconductor. A 1.5 µm-thick photosensitive organic insulation layer is then formed on the organic semiconductor layer by spin-coating a photoacryl (Dongjin Semichem Co., Ltd.) and heat-treating it at 100° C.

An photo mask is disposed on the photosensitive organic insulation layer and exposed to uv light under a condition of 100 mJ/cm$^2$ and developed with developer and washed with deionized water. The washed product is thermally cured at 130° C. for 2 hours. An Al electrode is formed on the photosensitive organic insulation layer by depositing aluminum (Al) and performing photolithography, fabricating a thin film transistor device.

Evaluation

Evaluation 1: Adherence

The thin film transistor devices according to Example 1 and Comparative Example 1 were evaluated regarding adherence between the Al electrode and the lower layer therein.

Figure 9:
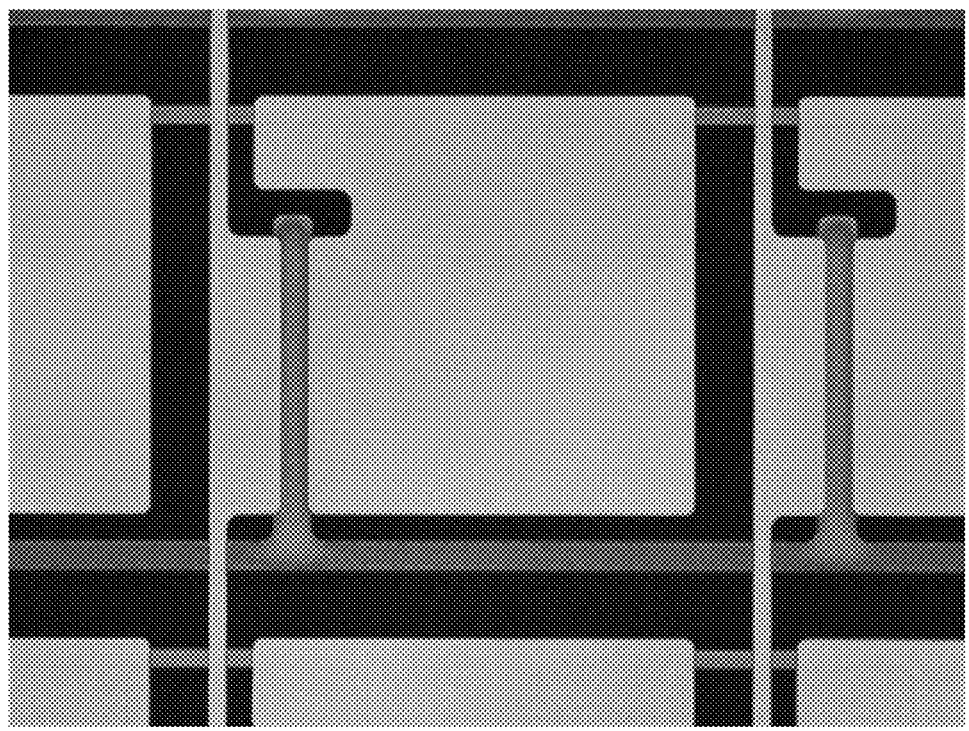
FIG. 9 is a plane photograph showing a thin film transistor device according to Example 1.
Figure 10:
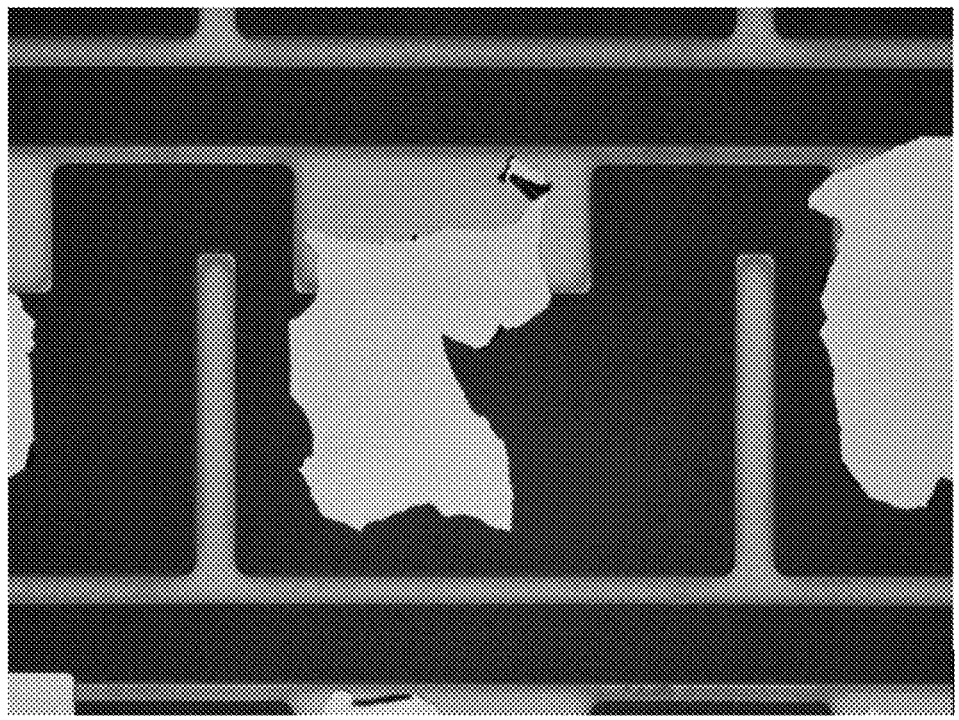
FIG. 10 is a plane photograph showing a thin film transistor device according to Comparative Example 1.

FIG. 9 is a plane photograph showing the thin film transistor device according to Example 1, while FIG. 10 is a plane photograph showing the thin film transistor device according to Comparative Example 1.

Referring to FIGS. 9 and 10, the thin film transistor device according to Example 1 has improved adherence between the photosensitive organic insulation layer and the Al electrode and shows that the Al electrode is neither lifted nor peeling, while the thin film transistor device according to Comparative Example 1 shows that the Al electrode is mostly peeled off and forms a faulty pattern.

Evaluation 2: Thin Film Transistor Characteristics

The thin film transistor devices according to Example 1 and Comparative Example 1 and 2 are evaluated regarding thin film transistor characteristics.

Table 1 shows charge mobility and threshold voltage of the thin film transistor devices according to Example 1 and Comparative Examples 1 and 2.

TABLE 1

| | Charge mobility (cm²/V·s) | | Threshold voltage (Vth, V) | |
|---|---|---|---|---|
| Drain Voltage | $V_D = -5$ V | $V_D = -40$ V | $V_D = -5$ V | $V_D = -40$ V |
| Example 1 | 3.0 | 5.0 | −9.3 | −7.7 |
| Comparative Example 1 | 2.8 | 4.5 | −7.6 | −7.0 |
| Comparative Example 2 | N/A | N/A | N/A | N/A |

*N/A: Not operated

Referring to Table 1, the thin film transistor device according to Example 1 has similar charge mobility and threshold voltage to those of the thin film transistor device according to Comparative Example 1. Accordingly, the thin film transistor according to Example 1 is not deteriorated by the subsequent processes after forming the fluorine-containing organic insulation layer.

On the other hand, the thin film transistor device according to Comparative Example 2 is not operated, since the organic semiconductor therein is severely damaged.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

What is claimed is:

1. A thin film transistor panel, comprising:
    a gate electrode on a substrate;
    a gate insulating layer on the gate electrode;
    an organic semiconductor overlapping with the gate electrode;
    a source electrode and a drain electrode electrically connected to the organic semiconductor;
    a fluorine-containing organic insulation layer covering the organic semiconductor; and
    a photosensitive organic insulation layer covering the fluorine-containing organic insulation layer,
    wherein the fluorine-containing organic insulation layer and the photosensitive organic insulation layer include a contact hole,
    wherein the fluorine-containing organic insulation layer and the photosensitive organic insulation layer are on the whole surface of the substrate except for the contact hole, and completely cover the top surface of the source electrode and the drain electrode except for the contact hole,
    wherein a portion of the photosensitive organic insulation layer and a portion of the fluorine-containing organic insulation layer not overlapping the organic semiconductor have a same thickness, and
    wherein the photosensitive organic insulation layer has a same thickness along an entire length thereof in a horizontal direction except for the contact hole.

2. The thin film transistor panel of claim 1, wherein the fluorine-containing organic insulation layer includes at least one of a fluorine-based polymer and a fluorine-based solvent.

3. The thin film transistor panel of claim 2, wherein the fluorine-containing organic insulation layer includes at least one of a perfluorinated polymer, polytetrafluoroethylene (PTFE), a fluorinated ethylene propylene (FEP), a poly (fluoro alkoxy), ethylene tetrafluoroethylene (ETFE), polyvinylidene fluoride (PVDF), and a perfluoro(alkenylvinyl ether).

4. The thin film transistor panel of claim 1, wherein the fluorine-containing organic insulation layer is non-photosensitive.

5. The thin film transistor panel of claim 1, wherein the fluorine-containing organic insulation layer has a thickness of about 0.1 μm to about 1.0 μm.

6. The thin film transistor panel of claim 1, wherein the photosensitive organic insulation layer includes at least one of polyacryl, polysiloxane, and polyimide.

7. The thin film transistor panel of claim 1, wherein the photosensitive organic insulation layer has a thickness of about 0.1 μm to about 1.0 μm.

8. The thin film transistor panel of claim 1, wherein the contact hole of the fluorine-containing organic insulation layer and the photosensitive organic insulation layer has a same plane shape.

9. An electronic device comprising the thin film transistor panel of claim 1.

10. The electronic device of claim 9, wherein the electronic device includes at least one of a liquid crystal display (LCD), an organic light emitting diode (OLED) device, an electrophoretic display, and an organic sensor.

11. A method of manufacturing the thin film transistor panel, comprising:
    forming a gate electrode on a substrate;
    forming a gate insulating layer on the gate electrode;
    forming an organic semiconductor overlapping with the gate electrode on the gate insulating layer;
    forming a source electrode and a drain electrode electrically connected to the organic semiconductor;
    forming a fluorine-containing organic insulation layer on the organic semiconductor;
    forming a photosensitive organic insulation layer on the fluorine-containing organic insulation layer;
    wet-etching the photosensitive organic insulation layer to form a patterned photosensitive organic insulation layer including a contact hole; and
    dry-etching the fluorine-containing organic insulation layer using the patterned photosensitive organic insulation layer as a mask to form a contact hole in the fluorine-containing organic insulation layer,
    wherein the fluorine-containing organic insulation layer and the photosensitive organic insulation layer are on the whole surface of the substrate except for the contact hole in the fluorine-containing organic insulation layer and the photosensitive organic insulation layer, respectively, and completely cover the top surface of the source electrode and the drain electrode except for the contact hole,
    wherein a portion of the photosensitive organic insulation layer and a portion of the fluorine-containing organic insulation layer not overlapping the organic semiconductor have a same thickness, and
    wherein the photosensitive organic insulation layer has a same thickness along an entire length thereof in a horizontal direction except for the contact hole.

12. The method of claim 11, wherein the forming a fluorine-containing organic insulation layer and the forming a photosensitive organic insulation layer forms the fluorine-containing organic insulation layer and the photosensitive organic insulation layer at a temperature of less than or equal to about 150° C.

13. The method of claim 11, further comprising:
surface treating the fluorine-containing organic insulation layer after the forming a fluorine-containing organic insulation layer.

14. The method of claim 13, wherein the surface treating includes using oxygen plasma.

15. The method of claim 11, further comprising:
thermal curing the patterned photosensitive organic insulation layer at a temperature of less than or equal to about 150° C. after the wet-etching the photosensitive organic insulation layer.

16. The method of claim 15, wherein the thermal curing is performed at a temperature of about 70° C. to about 150° C.

\* \* \* \* \*